United States Patent
Yatsuda et al.

(10) Patent No.: US 10,325,780 B2
(45) Date of Patent: Jun. 18, 2019

(54) METHOD OF MANUFACTURING SEMICONDUCTOR DEVICE

(71) Applicant: TOKYO ELECTRON LIMITED, Tokyo (JP)

(72) Inventors: Koichi Yatsuda, Tokyo (JP); Takashi Hayakawa, Tokyo (JP); Tatsuya Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 4 days.

(21) Appl. No.: 15/831,831

(22) Filed: Dec. 5, 2017

(65) Prior Publication Data
US 2018/0158693 A1    Jun. 7, 2018

(30) Foreign Application Priority Data
Dec. 7, 2016 (JP) .................. 2016-237922

(51) Int. Cl.
*H01L 21/311* (2006.01)
*H01L 21/02* (2006.01)
*H01L 21/768* (2006.01)
*H01L 23/532* (2006.01)

(52) U.S. Cl.
CPC .. *H01L 21/31144* (2013.01); *H01L 21/02282* (2013.01); *H01L 21/02321* (2013.01); *H01L 21/02337* (2013.01); *H01L 21/02359* (2013.01); *H01L 21/31111* (2013.01); *H01L 21/31138* (2013.01); *H01L 21/76802* (2013.01); *H01L 21/76832* (2013.01); *H01L 23/5329* (2013.01)

(58) Field of Classification Search
CPC ......... H01L 21/31144; H01L 21/02337; H01L 21/02282
See application file for complete search history.

(56) References Cited

U.S. PATENT DOCUMENTS

| | | | |
|---|---|---|---|
| 9,414,445 B2 | 8/2016 | Ahmad et al. | |
| 2006/0069171 A1* | 3/2006 | Prokopowicz | C08J 9/26 521/61 |
| 2012/0329273 A1* | 12/2012 | Bruce | H01L 21/02203 438/653 |

* cited by examiner

*Primary Examiner* — Jay C Chang
*Assistant Examiner* — Mikka Liu
(74) *Attorney, Agent, or Firm* — Nath, Goldberg & Meyer; Jerald L. Meyer

(57) ABSTRACT

There is provided a method of manufacturing a semiconductor device, which includes: supplying a raw material for polymerization to a porous low dielectric constant film formed on a substrate for manufacturing a semiconductor device, and filling holes formed in the porous low dielectric constant film with a polymer having a urea bond; subsequently, forming a pattern mask for etching on a surface of the porous low dielectric constant film; subsequently, etching the porous low dielectric constant film; subsequently, removing the pattern mask; and heating the substrate to depolymerize the polymer.

7 Claims, 14 Drawing Sheets

(Heating (depolymerization))

Thermal decomposition, PU removal

FIG. 6A (Spin-coating)
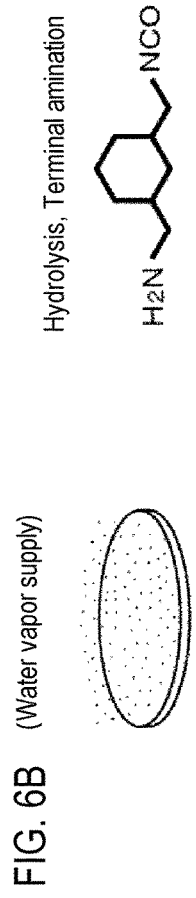
FIG. 6B (Water vapor supply)
FIG. 6C (Heating)
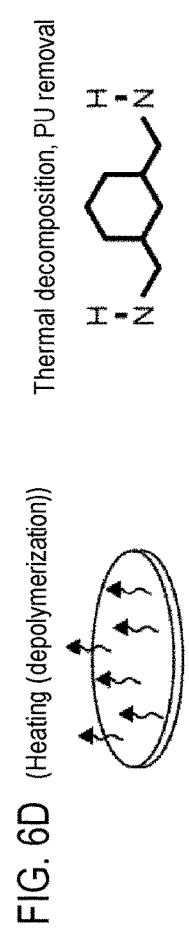
FIG. 6D (Heating (depolymerization))
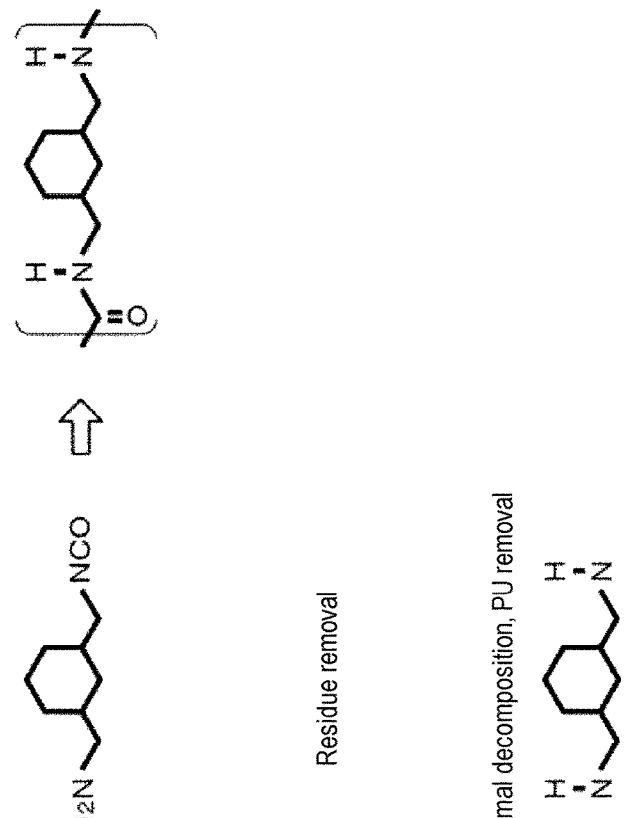

FIG. 11
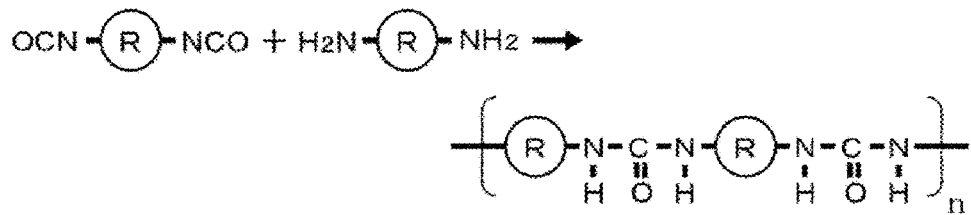
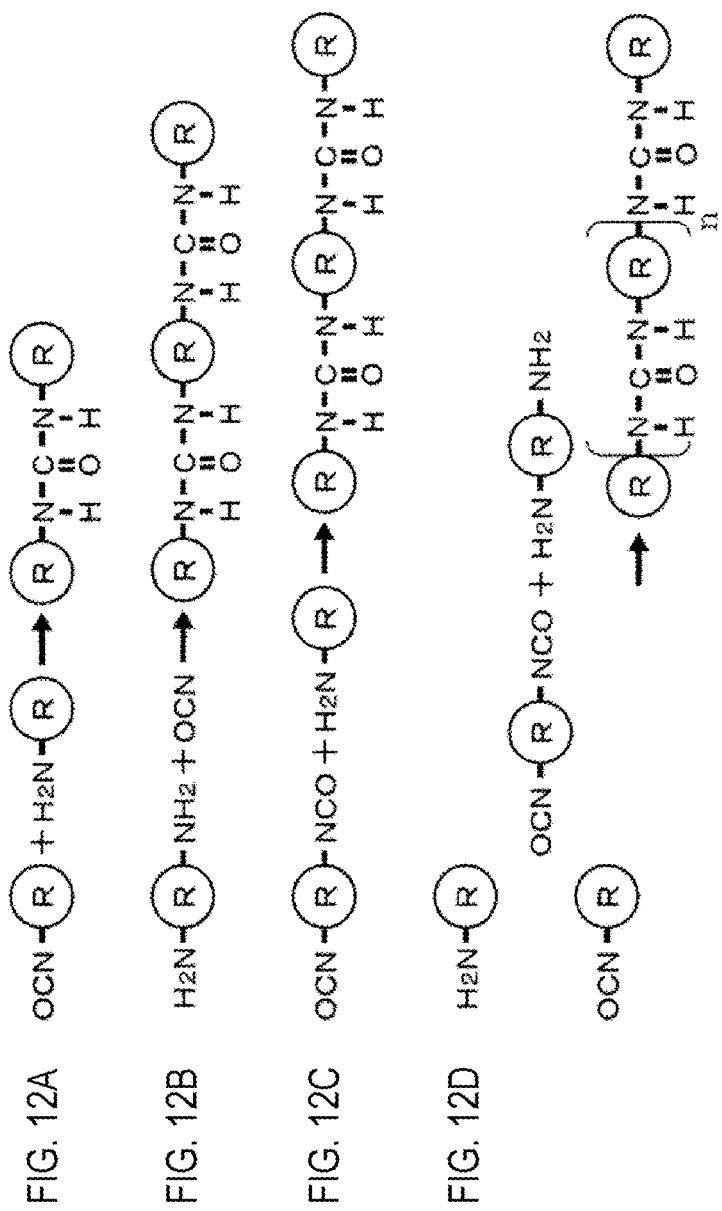
FIG. 12A
FIG. 12B
FIG. 12C
FIG. 12D

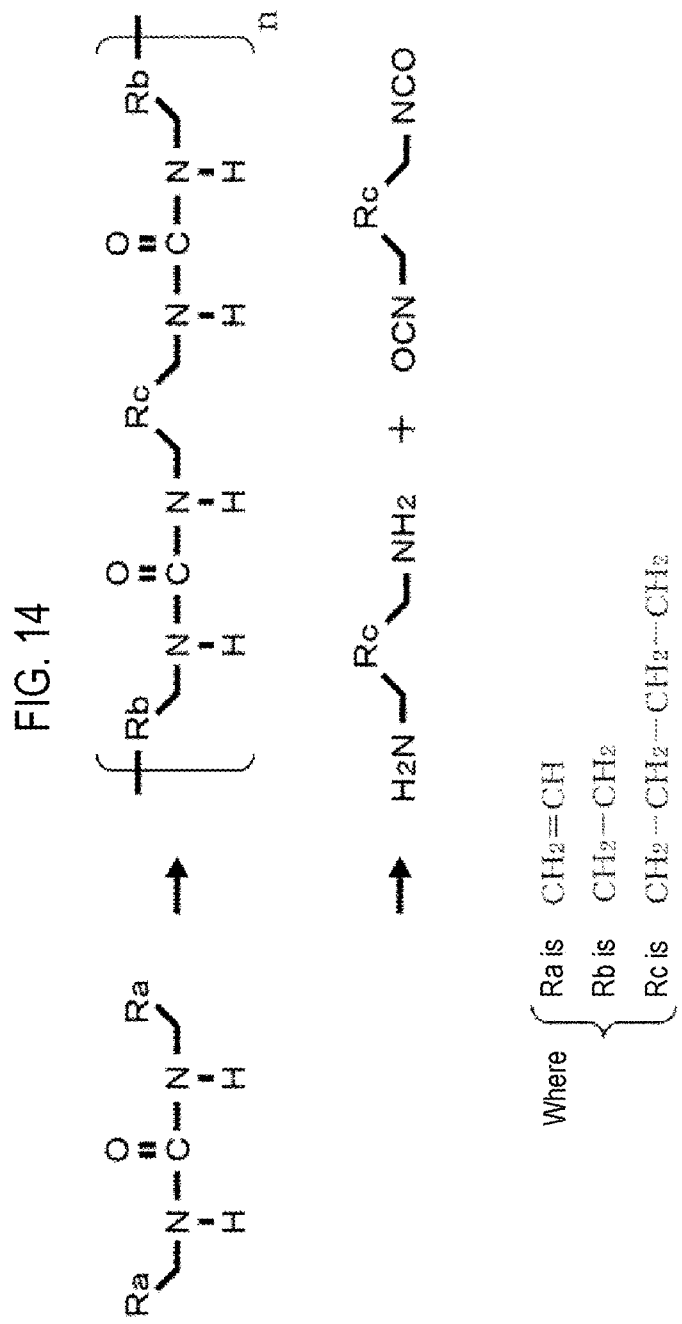

METHOD OF MANUFACTURING SEMICONDUCTOR DEVICE

CROSS-REFERENCE TO RELATED APPLICATION

This application is based upon and claims the benefit of priority from Japanese Patent Application No. 2016-237922, filed on Dec. 7, 2016, the entire contents of which are incorporated herein by reference.

TECHNICAL FIELD

The present disclosure relates to a technique for suppressing damage to a porous low dielectric constant film formed on a substrate for manufacturing a semiconductor device during etching or the like.

BACKGROUND

In the manufacture of multilayered semiconductor devices, a porous low dielectric constant film is used to reduce the parasitic capacitance of an interlayer insulating film in order to increase operation speed. An example of the porous low dielectric constant film may include a SiOC film containing silicon, carbon, oxygen and hydrogen and having Si—C bonds. The SiOC film is etched by, for example, plasma of a $CF_4$ gas, which is a CF-based gas, using a resist mask and a lower layer mask in order to fill the SiOC film with a wiring material such as copper, and then the resist mask is ashed by plasma of an oxygen gas.

In addition, when the SiOC film is subjected to a plasma treatment such as etching or ashing, in an exposed surface of the SiOC film exposed to the plasma, namely a side wall and a bottom surface of a concave portion of the film, for example, some Si—C bonds are broken and C is desorbed from the film due to the plasma. Si with an unsaturated bond generated by the desorption of C is unstable as it is. As such, Si is bonded to moisture or the like in the atmosphere to become Si—OH.

In this way, a damaged layer may be formed on the exposed surface of the SiOC film by the plasma treatment. Such a damaged layer has a low content of carbon, which decreases the dielectric constant. As the line width of a wiring pattern becomes smaller and smaller and a wiring layer, an insulating film and the like become thinner and thinner, the proportion of the effect of a surface portion on the whole wafer W, which may be a factor that causes the characteristics of a semiconductor device to deviate from a design value due to the decrease in dielectric constant, becomes larger and larger.

Techniques have been proposed which includes: filling hole portions of a porous low dielectric constant film formed on a substrate with PMMA (acrylic resin) in advance; performing a treatment such as etching with respect to the low dielectric constant film; heating the substrate; supplying a solvent onto the substrate; applying a microwave to the substrate; and removing the PMMA. However, in order to remove the PMMA, it is necessary to maintain plasma for about 20 minutes and to heat the substrate up to a temperature of 400 degrees C. or more, which may cause a problem that it is highly likely to have an adverse effect on elements already formed on the substrate.

SUMMARY

Some embodiments of the present disclosure provide a technique capable of suppressing damage to a porous low dielectric constant film formed on a substrate during etching and capable of avoiding adverse effects of heat on elements already formed on the substrate.

According to one embodiment of the present disclosure, there is provided a semiconductor device, which includes: supplying a raw material for polymerization to a porous low dielectric constant film formed on a substrate for manufacturing a semiconductor device, and filling holes formed in the porous low dielectric constant film with a polymer having a urea bond; subsequently, forming a pattern mask for etching on a surface of the porous low dielectric constant film; subsequently, etching the porous low dielectric constant film; subsequently, removing the pattern mask; and heating the substrate to depolymerize the polymer.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 6A to 6D are explanatory views showing sequentially processes of producing a polymer having a urea bond by self-polymerization using isocyanate and water.

FIG. 11 is an explanatory view showing a state in which a polymer having a urea bond is produced by a copolymerization-based reaction.

FIGS. 12A to 12D are explanatory views showing a reaction by which a polymer having a urea bond becomes an oligomer.

FIG. 14 is an explanatory view showing a state in which a monomer having a urea bond is crosslinked to produce a polymer having a urea bond.

DETAILED DESCRIPTION

Figure 1:
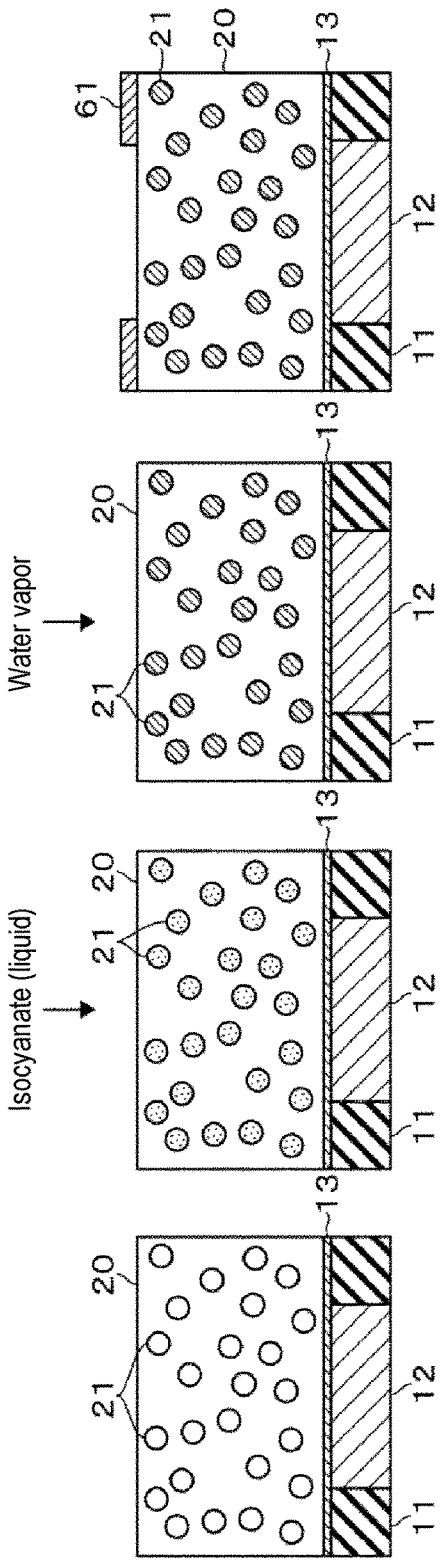
FIGS. 1A to 1D are explanatory views showing some steps of a semiconductor device manufacturing method according to an embodiment of the present disclosure.
Figure 2:
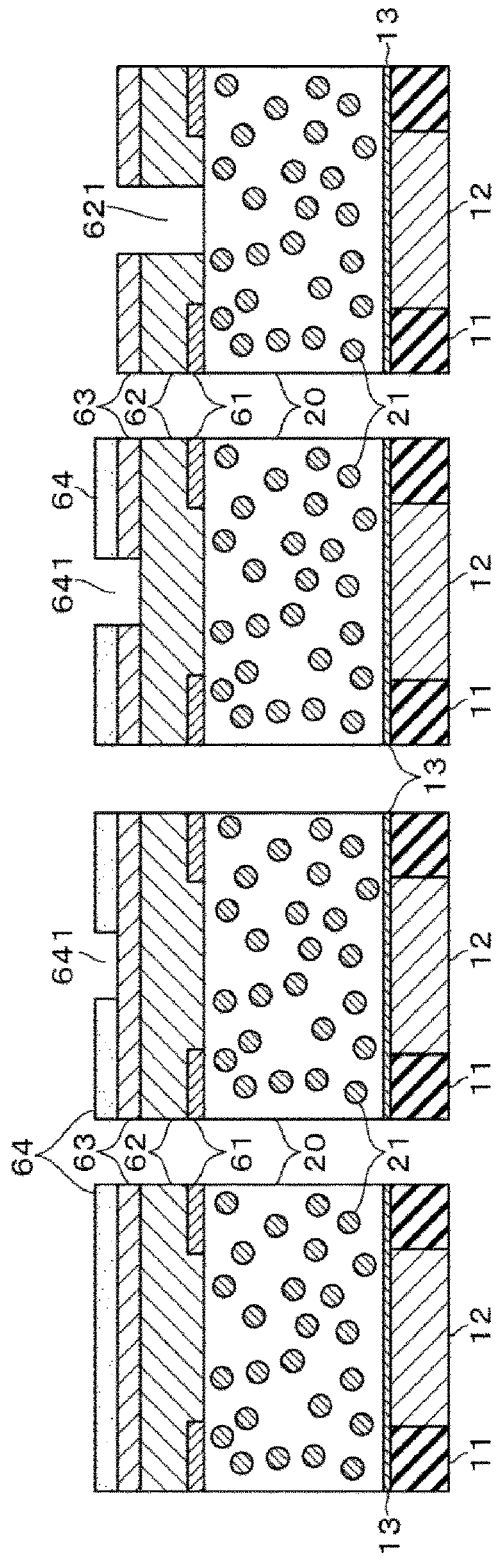
FIGS. 2E to 2H are explanatory views showing some steps of the semiconductor device manufacturing method according to the embodiment of the present disclosure.
Figure 3:
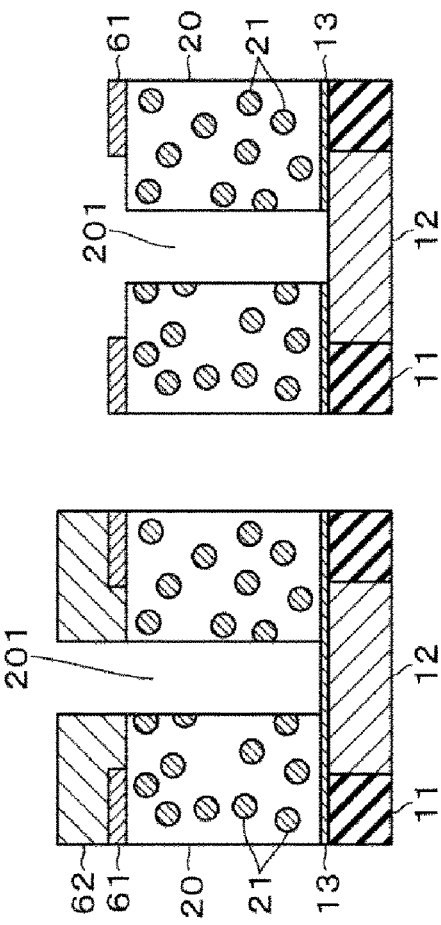
FIGS. 3I and 3J are explanatory views showing some steps of the semiconductor device manufacturing method according to the embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment in which a semiconductor device manufacturing method according to the present disclosure is applied to a process of forming wirings of a semiconductor device by using dual damascene will be described below. FIGS. 1A to 3J are explanatory views showing sequentially states in which a circuit portion of an upper layer side is formed on a circuit portion of a lower layer side. In FIGS. 1A to 3J, reference numeral 11 denotes, for example, an interlayer insulating film of the lower layer side, reference numeral 12 denotes a copper wiring which is a wiring material with which the interlayer insulating film 11 is filled, and reference numeral 13 denotes an etching stopper film acting as a stopper at the time of etching. The etching stopper film 13 is formed of, e.g., SiC (silicon carbide), SiCN (silicon carbide nitride) or the like.

A low dielectric constant film 20 as an interlayer insulating film is formed on the etching stopper film 13. In this embodiment, an SiOC film is used as the low dielectric constant film 20. The SiOC film is formed by, for example, plasmarizing diethoxymethylsilane (DEMS) and using a CVD method. The low dielectric constant film 20 is porous. In FIGS. 1A to 3J, holes 21 are shown extremely schematically in the low dielectric constant film 20. The SiOC film is also used as the interlayer insulating film 11 of the lower layer side.

In the method of this embodiment, as shown in FIG. 1A, a process begins from a state where the circuit portion of the lower layer side is formed on a surface of a semiconductor wafer (hereinafter simply referred to as a "wafer") as a substrate, and the low dielectric constant film 20 is formed on the circuit portion of the lower layer side.

In this embodiment, the holes 21 in the low dielectric constant film 20 are filled with a polymer having a urea bond (polyurea), which is a filling material, as follows. As a method for producing the polyurea, there is a method such as copolymerization as described later, but in this embodiment, a method of producing a polymer by self-polymerization will be described.

Figure 5:
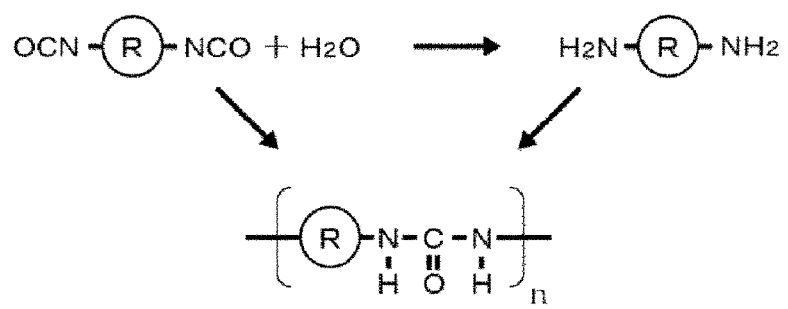
FIG. 5 is an explanatory view showing a state in which a polymer having a urea bond is produced by self-polymerization using isocyanate and water.

First, isocyanate (liquid), which is a raw material of self-polymerization, is impregnated into the low dielectric constant film 20 (FIG. 1B). Subsequently, moisture, for example, water vapor, is impregnated into the low dielectric constant film 20 (FIG. 1C). The isocyanate and the moisture react with each other so that the isocyanate is hydrolyzed to immediately produce polyurea. The holes 21 of the low dielectric constant film 20 are filled with the polyurea thus produced. FIG. 5 shows such a reaction in which a portion of the isocyanate becomes amine which is an unstable intermediate product, and the unstable intermediate product and the non-hydrolyzed isocyanate react with each other to produce the polyurea. In FIG. 5, R represents, for example, an alkyl group (linear alkyl group or cyclic alkyl group) or an aryl group, and n is an integer of two or more.

Figure 7:
FIG. 7 is a molecular structure diagram showing an example of molecular structure of isocyanate.

An example of the isocyanate may include an alicyclic compound, an aliphatic compound, an aromatic compound or the like. An example of the alicyclic compound may include 1,3-bis (isocyanatemethyl) cyclohexane (H6XDI) as shown in FIG. 6A to be described later. An example of the aliphatic compound may include hexamethylene diisocyanate as shown in FIG. 7. In some embodiments, the isocyanate may have a melting point of 100 degrees C. or less and is liquid at room temperature.

FIGS. 6A to 6D are explanatory views schematically showing the state of a process using H6XDI as a raw material monomer, in association with processes performed on the wafer W and respective chemical formulas. FIG. 6A corresponds to a process of supplying isocyanate onto the wafer W, as shown in FIG. 1B. First, by spin-coating the liquid of H6XDI on the wafer W, the liquid is impregnated into the low dielectric constant film 20.

Figure 8:
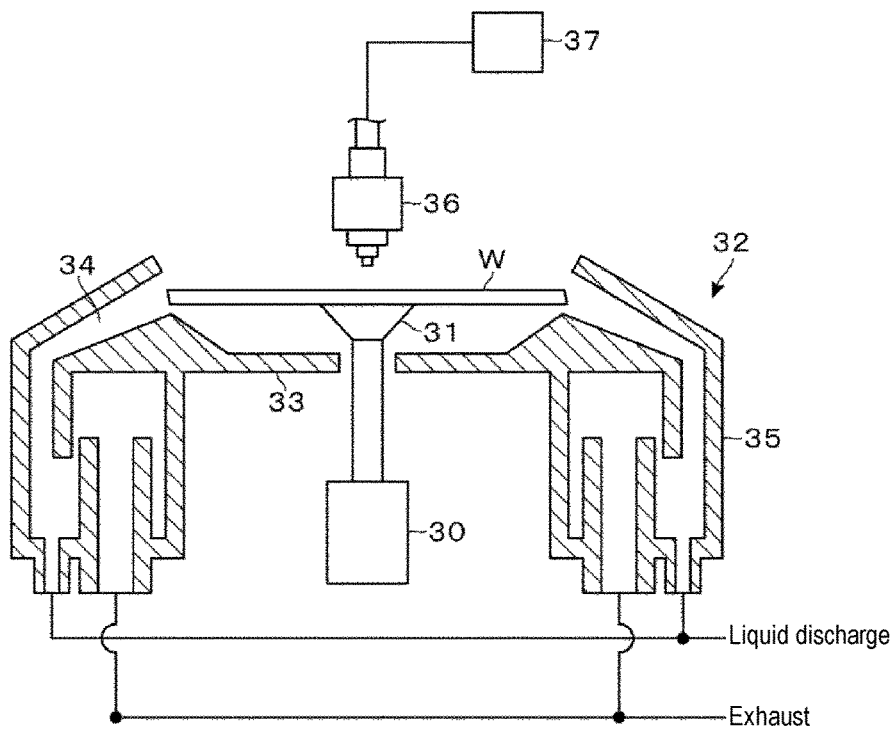
FIG. 8 is a cross-sectional view of an apparatus for supplying isocyanate liquid onto a substrate.

For example, an apparatus shown in FIG. 8 may be used as a spin coating apparatus for performing the spin-coating. In FIG. 8, reference numeral 31 denotes a vacuum chuck configured to rotate by a rotation mechanism 30 while adsorptively holding the wafer W, reference numeral 32 denotes a cup module, and reference numeral 33 denotes a guide member having a cylindrical outer peripheral wall and a cylindrical inner peripheral wall which extend downward. Reference numeral 34 denotes a discharge space formed between an outer cup 35 and the outer peripheral wall so as to perform exhaust and liquid discharge operations over the entire circumference. A lower side of the discharge space 34 has a structure capable of separating gas and liquid. The liquid is supplied from a liquid supply source 37 to the central portion of the wafer W via a nozzle 36 and the wafer W is rotated at a rotation speed of, for example, 1,500 rpm. Thus, the liquid is spread on the surface of the wafer W to form a coating film.

Subsequently, the wafer W is kept in a heating atmosphere of 80 degrees C. and a water vapor atmosphere (of relative humidity 100%) so that the water vapor permeates into the low dielectric constant film 20. FIG. 6B corresponds to the process of supplying the water vapor as moisture onto the wafer W, as shown in FIG. 1C.

Figure 9:
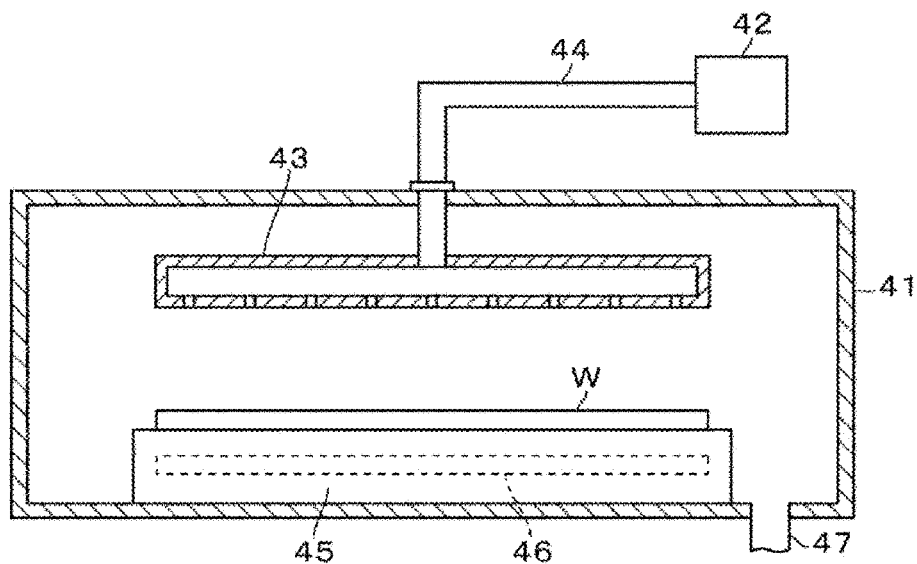
FIG. 9 is a cross-sectional view of an apparatus for supplying water vapor onto the substrate after the supply of the isocyanate liquid.

For example, an apparatus as shown in FIG. 9 may be used as an apparatus for supplying the water vapor. In FIG. 9, reference numeral 41 denotes a processing container in which the water vapor atmosphere is formed, reference numeral 42 denotes a water vapor generator, reference numeral 43 denotes a water vapor discharger having a large number of holes formed in its lower surface, reference numeral 44 denotes a pipeline for guiding the water vapor to a diffusion space inside the water vapor discharger 43, reference numeral 45 denotes a mounting table incorporating a heater 46, and reference numeral 47 denotes an exhaust pipe in which an exhaust operation is performed by a suction mechanism. An inner wall of the processing container 41 is heated to, for example, 80 degrees C. by a heating mechanism (not shown). The wafer W is mounted on the mounting table 45 and is exposed to the atmosphere of the water vapor discharged from the water vapor discharger 43.

In some embodiments, instead of providing the water vapor generator 42 and the water vapor discharger 43 as an apparatus for performing the water vapor process, a flat container with a lid may be provided above the mounting table 45 and may be heated in a state where water is accommodated in the container so that the interior of the processing container 41 is kept in the water vapor atmosphere. In this case, the container is closed by the lid while the wafer W is loaded/unloaded.

Since the H6XDI has been already impregnated into the low dielectric constant film 20, when the water vapor permeates into the low dielectric constant film 20, hydrolysis occurs as described above and a polymerization reaction occurs immediately to produce polyurea. Therefore, the holes 21 in the low dielectric constant film 20 are fully filled with the polyurea. In FIG. 1, a state where the holes 21 are filled with the raw material monomer (the liquid of H6XDI in this embodiment) is indicated by "dots" for the sake of convenience, and a state where the holes 21 are filled with the polyurea is indicated by "oblique lines" for the sake of convenience.

Figure 10:
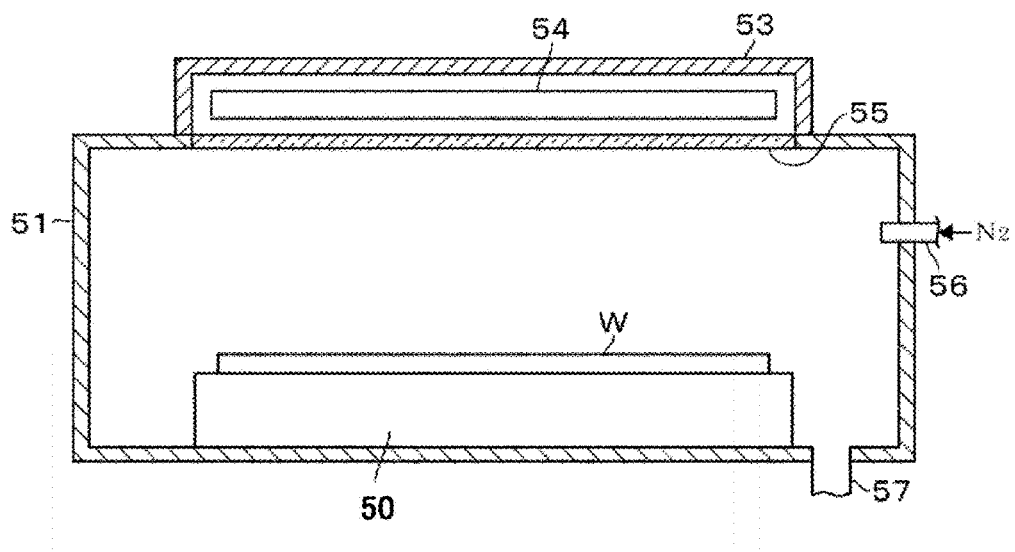
FIG. 10 is a cross-sectional view of a heating apparatus for heating the substrate onto which the isocyanate and the water vapor are supplied.

Subsequently, the wafer W is heated to remove residue present in the low dielectric constant film 20 (FIG. 6C). The heating temperature is set to, for example, 200 degrees C. or higher, specifically 250 degrees C. The wafer W is heated in an inert gas atmosphere, for example, a nitrogen gas atmosphere. For example, as shown in FIG. 10, this process can be carried out by mounting the wafer W on a mounting table 50 inside a processing container 51 and heating the wafer W with an infrared lamp 54 inside a lamp house 53. In FIG. 10, reference numeral 55 denotes a transmission window, reference numeral 56 denotes a supply pipe for supplying a nitrogen gas therethrough, and reference numeral 57 denotes an exhaust pipe. A processing atmosphere may be, for example, either a normal pressure atmosphere or a vacuum atmosphere.

In this way, the holes 21 of the low dielectric constant film 20 are filled with the polyurea. Subsequently, a process of forming a via hole and trench (wiring-burying groove) in the low dielectric constant film 20 is performed. First, as shown in FIG. 1D, a hard mask 61, which is a pattern mask for etching, formed of, e.g., a titanium nitride (TiN) film, having an opening corresponding to the trench, is formed on the surface of the low dielectric constant film 20 using a method known in the art.

Subsequently, a masking film 62 serving as a mask used to etch the via hole is formed on the low dielectric constant film 20 and the hard mask 61. Further, an antireflection film 63 and a resist film 64 are stacked in this order on the masking film 62 (FIG. 2E). For example, an organic film containing carbon as a main component is used as the masking film 62. The organic film is obtained by spin-coating a chemical solution on the wafer W inside an apparatus for forming the antireflection film 63 and the resist film 64 to form a resist pattern.

Then, the resist film 64 is subjected to exposure and development processes so that the resist pattern having an opening 641 formed in a portion corresponding to the via hole is formed (FIG. 2F). The resist pattern is used to etch the antireflection film 63 with, for example, a CF-based gas (FIG. 2G). Subsequently, by using the antireflection film 63 as a mask, the masking film 62 is etched by plasma obtained by plasmarizing an oxygen gas, for example. At this time, the resist film 64 is also etched away (FIG. 2H). Thus, an opening 621 is formed in the portion corresponding to the via hole in the masking film 62.

Subsequently, by using the masking film 62 as an etching mask, the low dielectric constant film 20 is etched to form a via hole 201 (FIG. 3I). The low dielectric constant film 20 (the SiOC film in this embodiment) may be etched by plasma obtained by plasmarizing a $C_6F_6$ gas. In this case, a small amount of oxygen gas may be added.

Thereafter, the etching stopper film 13 at the bottom of the via hole 201 is etched away. In the case where the etching stopper film 13 is, for example, a SiC film, the etching may be performed by plasma obtained by plasmarizing a $CF_4$ gas, for example. Subsequently, the masking film 62 is ashed away by plasma obtained by plasmarizing an oxygen gas (FIG. 3J).

Figure 4:
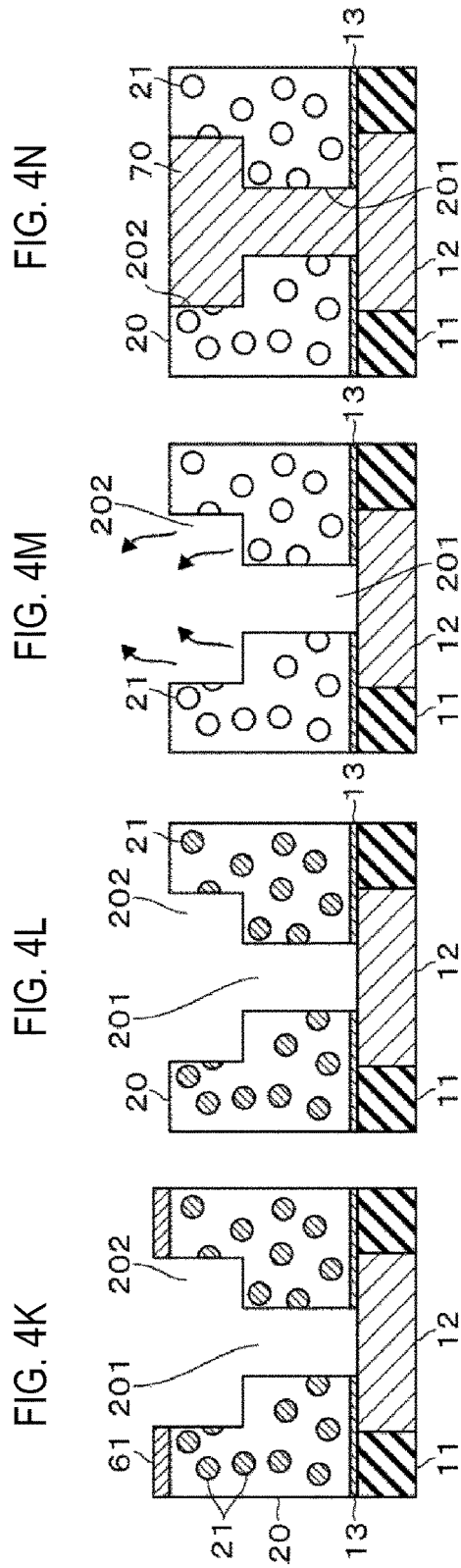
FIGS. 4K to 4N are explanatory views showing some steps of the semiconductor device manufacturing method according to the embodiment of the present disclosure.

Thereafter, similar to the process of forming the via hole 201, the low dielectric constant film 20 is etched using the hard mask 61 to form a trench 202 in a region surrounding the via hole 201 (FIG. 4K). Thereafter, the hard mask 61 is removed (FIG. 4L). When the hard mask 61 is a TiN film, the hard mask 61 may be removed by, for example, a wet etching using a mixture of sulfuric acid, hydrogen peroxide and water as an etching solution.

In the above, it is necessary to carry out the respective processes performed thus far at a temperature lower than the temperature at which the polyurea is depolymerized.

After the via hole 201 and the trench 202 are formed in the low dielectric constant film 20 in this way, the polyurea which is a filling material with which the holes 21 of the low dielectric constant film 20 are filled is removed (FIG. 4M). The polyurea is evaporated by being depolymerized into amine when being heated to 300 degrees C. or higher, specifically 350 degrees C. (FIG. 6D). However, in order not to adversely affect an element portion already formed on the wafer W, particularly a copper wiring, the polyurea may be heated at a temperature lower than 400 degrees C., specifically 390 degrees C. or lower, more specifically at a temperature ranging from 300 to 350 degrees C. A period of time during which the polyurea is depolymerized, for example, a period of time during which the polyurea is heated at a temperature ranging from 300 to 400 degrees C., may be 5 minutes or less from the viewpoint of suppressing a thermal damage to the element portion. Therefore, examples of the heating recipe may include a temperature of 350 degrees C. and the period time of 5 minutes or less. As a heating method, the infrared lamp described earlier may be used. Alternatively, the wafer W mounted on a mounting table incorporating a heater may be heated. The heating atmosphere may be an atmosphere of inert gas such as nitrogen gas.

The low dielectric constant film 20 from which the polyurea has been removed returns to the original porous film. Subsequently, the via hole 201 and the trench 202 are filled with copper, and an excessive copper is removed by CMP (Chemical Mechanical Polishing) to form a copper wiring 70, thereby forming a circuit portion of the upper layer side (FIG. 4N). Although not shown in FIG. 4N, before the copper wiring 70 is formed, for example, a barrier metal layer formed of a laminated film of Ti and TiON and a seed layer made of copper are formed in the via hole 201 and the trench 202.

In the above embodiment, the isocyanate and the moisture are sequentially supplied onto the low dielectric constant film 20 to fill the holes 21 in the low dielectric constant film 20 with the polyurea which is a polymer having a urea bond. In this state, the low dielectric constant film 20 is etched to form the via hole 201 and the trench 202, and the etching mask is ashed. Therefore, in this embodiment, since the low dielectric constant film 20 is protected by the polyurea at the time of etching and ashing performed as the plasma treatment, it is possible to suppress damage to the low dielectric constant film 20. In addition, since the polyurea is depolymerized at a temperature of about 300 degrees C., the polyurea can be removed from the low dielectric constant film 20 without adversely affecting the element portions already formed on the wafer W, particularly the copper wiring. Further, the polyurea can be removed merely only by the heating treatment. Thus, the process is simple.

In the above embodiment, the isocyanate is spin-coated on the wafer W. However, mists of isocyanate may be supplied in a state where the wafer W remains stationary.

In the above embodiment, a polyurea film is produced by the self-polymerization of the isocyanate. However, as shown in an example in FIG. 11, a polyurea film may be produced by copolymerization using isocyanate and amine. R represents, for example, an alkyl group (linear alkyl group or cyclic alkyl group) or an aryl group and n is an integer of two or more.

In this case, for example, a method may be employed in which a liquid which is one of isocyanate and amine is supplied onto the wafer W by the aforementioned spin coating method to allow the liquid to permeate into the low dielectric constant film, and subsequently, the other liquid of isocyanate and amine is similarly supplied onto the wafer W by the aforementioned spin coating method to allow the other liquid to permeate into the low dielectric constant film. In addition, the isocyanate and the amine may be alternately supplied multiple times so that they can be sequentially supplied onto the wafer W in the form of gas (vapor). In this case, for example, vapor of the isocyanate is diffused into and adsorbed onto the holes of the low dielectric constant film, and subsequently, vapor of the amine is diffused into the holes to cause a polymerization reaction. Such action is repeated so as to fully fill the holes with the polyurea film.

The polyurea itself is a solid and cannot be liquefied. Thus, as described above, a method of separately supplying a raw material of the polyurea to a film to produce the polyurea in the film, is employed.

In a method using vapor of raw material monomers, vapor pressures of the raw material monomers may be far apart from each other, for example by one digit or more. This is because, with a combination in which the vapor pressures are close to each other, for example, when the amine is diffused into the holes of the low dielectric constant film, it may be adsorbed onto the surface of the holes, which deteriorates the efficiency of reaction with the isocyanate.

An example of the combination in which a difference in the vapor pressures of isocyanate and amine is of one digit or more may include a combination of isocyanate and amine in which a skeleton molecule obtained by removing an isocyanate functional group from the isocyanate is the same as a skeleton molecule obtained by removing an amine functional group from the amine, namely, the isocyanate and the amine have the same skeleton molecule. For example, the vapor pressure of H6XDA to which the amine functional group is bonded is higher by one digit or more than the vapor pressure of H6XDI having the same skeleton molecule as the H6XDA to which the isocyanate functional group is bonded.

Further, as shown in FIGS. 12A to 12D, mono-functional molecules may be used as the raw material monomers.

Figures 13A, 13B:
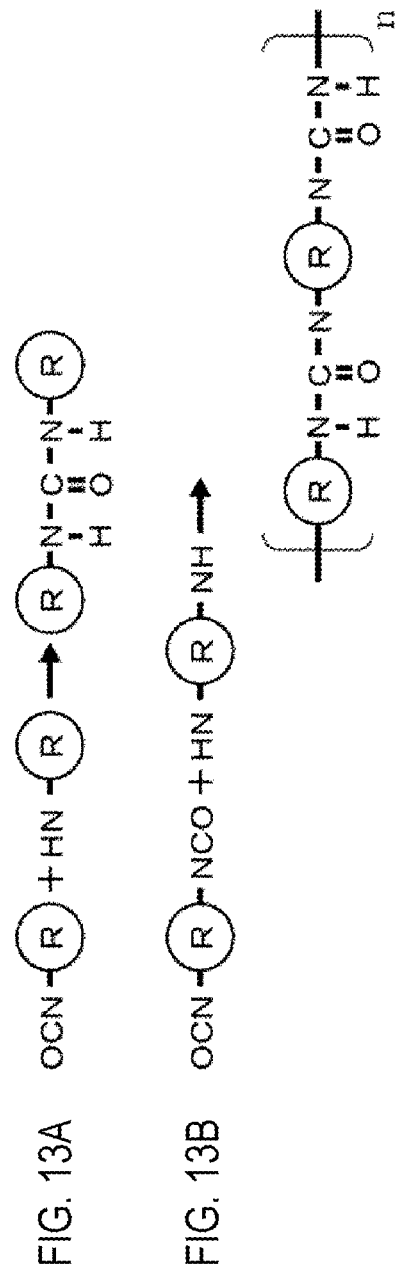
FIGS. 13A and 13B are explanatory views showing a state in which a secondary amine is used to produce a polymer having a urea bond.

Furthermore, as shown in FIGS. 13A and 13B, isocyanate and secondary amine may be used. In this case, a produced polymer also has a urea bond.

Further, the raw material monomers having a urea bond may be polymerized to obtain a polyurea film. In this case, the raw material monomers can be supplied onto the low dielectric constant film in the form of liquid, mist or vapor. FIG. 14 shows such a case in which polymerization is generated by irradiating the raw material monomers with light, for example, ultraviolet rays, and providing light energy to the raw material monomers caused, which produces a polyurea film. The polyurea film is heated at 350 degrees C. so as to be depolymerized into isocyanate and amine.

Figure 15:
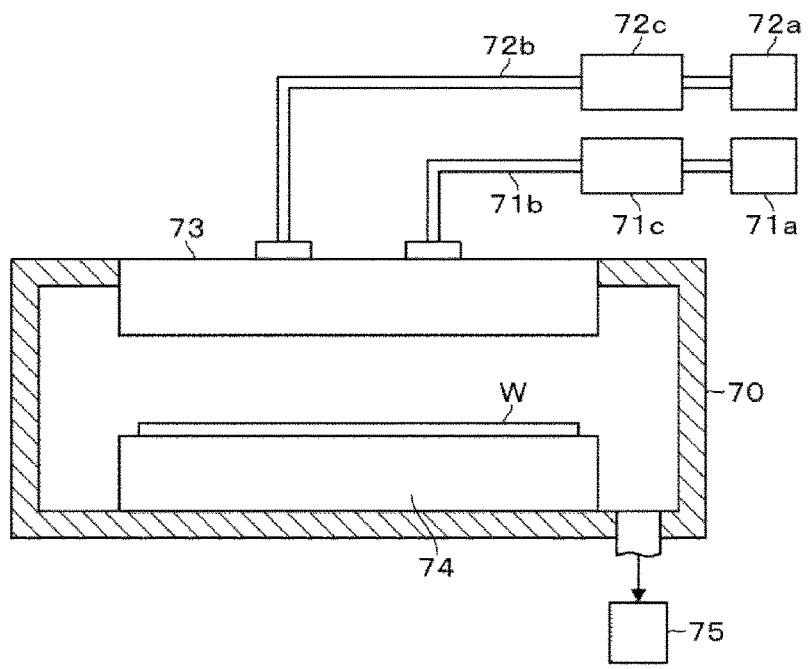
FIG. 15 is a cross-sectional view of an apparatus for reacting isocyanate and amine with water vapor to produce a polymer having a urea bond.

FIG. 15 shows a CVD apparatus for reacting raw material monomers with each other in the form of gas to produce (vapor-deposition-polymerize) polyurea in the low dielectric constant film 20 (vapor deposition polymerization). In FIG. 15, reference numeral 70 denotes a vacuum container partitioning a vacuum atmosphere, and reference numerals 71a and 72a denote raw material supply sources for accommodating liquids of isocyanate and amine which are raw material monomers, respectively. The liquid of isocyanate and the liquid of amine are vaporized by respective vaporizers 71c and 72c installed in respective supply pipes 71b and 72b. Each vapor thus generated is introduced into a shower head 73 which is a gas discharger. The shower head 73 has a large number of discharge holes formed in the lower surface thereof, and is configured to discharge the vapor of isocyanate and the vapor of amine from the respective discharge holes into a treatment atmosphere. The wafer W is mounted on a mounting table 74 equipped with a temperature control mechanism. First, the vapor of isocyanate is supplied onto the wafer W and is then introduced into the low dielectric constant film on the wafer W. Subsequently, the supply of the isocyanate vapor is stopped, and the interior of the vacuum container 70 is evacuated. Thereafter, the vapor of amine is supplied onto the wafer W. As a result, the isocyanate remaining in the low dielectric constant film reacts with the amine to produce polyurea.

Examples

A low dielectric constant film formed of a SiOC film was formed on a bare wafer and the above-described operation shown in FIGS. 6A to 6C was performed on the wafer to fill the low dielectric constant film with polyurea. Thereafter, the operation shown in FIG. 6D was performed to depolymerize the polyurea to remove it from the low dielectric constant film. The heating treatment for depolymerizing the polyurea was carried out at 350 degrees C. for 5 minutes. The film thickness, the refractive index, the electric capacity and the dielectric constant of each of a low dielectric constant film before being filled with polyurea, a low dielectric constant film filled with polyurea, and a low dielectric constant film with the polyurea removed therefrom were measured. The measurement results are listed in the following table.

TABLE

|  | Before filling | After filling | After removal |
| --- | --- | --- | --- |
| Film thickness (nm) | 193.7 | 194.3 | 196.0 |
| Refractive index | 1.303 | 1.445 | 1.286 |
| Electrical capacity (pF) | 73 | 91 | 68 |
| Dielectric constant | 2.2 | 2.5 | 2.1 |

Figure 16:
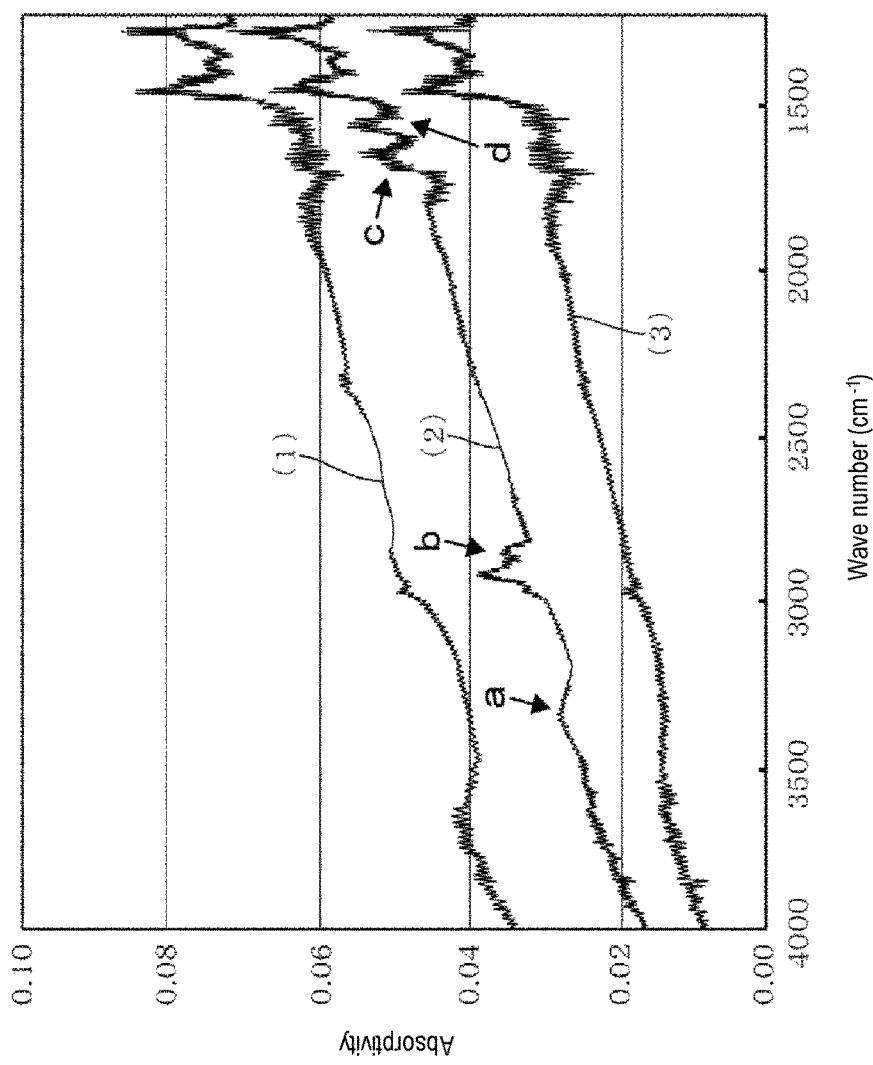
FIG. 16 is a characteristic diagram of absorption spectra before and after filling a low dielectric constant film with polyurea.

In addition, absorption spectra were measured for each of the low dielectric constant film before being filled with polyurea, the low dielectric constant film filled with polyurea, and the low dielectric constant film with the polyurea removed therefrom were measured. The measurement results are as shown in FIG. 16. Reference numerals (1) to (3) in FIG. 16 correspond to before filling, after filling and after removal, respectively. Peaks corresponding to an NH bond (indicted by an arrow a), a $CH_2$ bond (indicated by an arrow b), a CO bond (indicated by an arrow c) and a CN bond (indicated by an arrow d) are seen after filling (2), but these peaks are not seen either before filling (1) or after removal (3).

Figure 17:
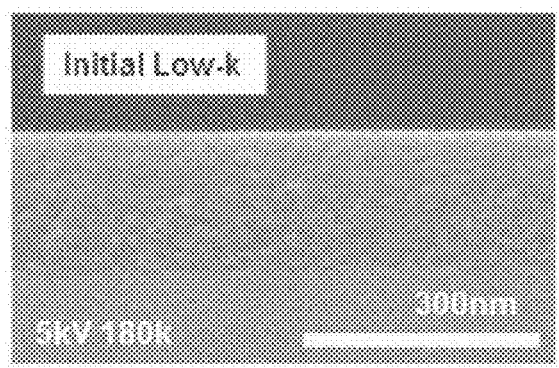
FIG. 17 is a scanning microscope photograph of a low dielectric constant film before filling of polyurea.
Figure 18:
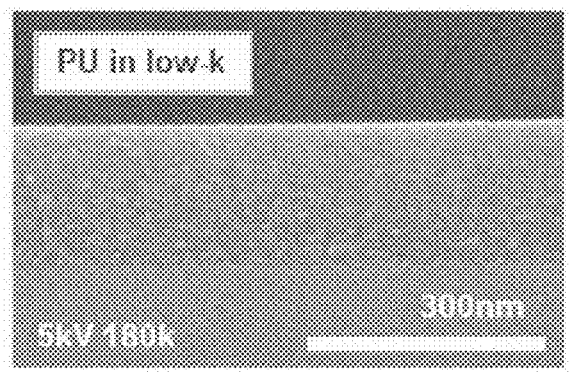
FIG. 18 is a scanning microscope photograph of a low dielectric constant film after filling of polyurea.

In addition, photographs of the low dielectric constant films before filling and after filling, which were taken by a scanning microscope, are shown in FIGS. 17 and 18, respectively.

It can be seen from the above that, when the low dielectric constant film is filled with polyurea, the film quality is slightly changed as the dielectric constant slightly increases, but the low dielectric constant film returns to the original film quality by depolymerizing and removing the polyurea.

In particular, considering measurement errors and the like, it can be said that the dielectric constant is not changed at all. In addition, it is supported by the characteristic diagram of the absorption spectra that the holes in the low dielectric constant film are filled with the polyurea by the method described in the above embodiment and that the polyurea is removed so that it is not left in the low dielectric constant film at all.

In addition, in comparison between the photographs of FIGS. 17 and 18, it can be observed that white granular particles are scattered in the film after filling and the film is filled with polyurea. Further, it may be seen from the film thickness measurement results that the film thickness slightly fluctuates before filling and after filling, but it can be seem from the photographs that there is almost no fluctuation in the film thickness.

According to the present disclosure in some embodiments, a raw material for polymerization is supplied to a low dielectric constant film, and holes formed in the low dielectric constant film are filled with a polymer having a urea bond. An etching is performed and subsequently, a substrate is heated to depolymerize the polymer. Therefore, when etching the low dielectric constant film, it is protected by the polymer. This suppresses damage to the low dielectric constant film. In addition, a polymer having a urea bond is depolymerized at a low temperature (400 degrees C. or less). Thus, when removing the polymer, there is no possibility of adversely affecting element portions already formed on the substrate. Further, it is possible to easily remove the polymer from the low dielectric constant film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

supplying a raw material for polymerization to a porous low dielectric constant film formed on a substrate for manufacturing a semiconductor device, and filling holes formed in the porous low dielectric constant film with a polymer having a urea bond;

subsequently, forming a pattern mask for etching on a surface of the porous low dielectric constant film;

subsequently, etching the porous low dielectric constant film;

subsequently, removing the pattern mask; and heating the substrate to depolymerize the polymer, wherein the step of filling includes:

impregnating a liquid or mists of isocyanate into the porous low dielectric constant film;

supplying a moisture to the porous low dielectric constant film;

hydrolyzing the isocyanate to produce an amine; and heating the substrate to cause the isocyanate and the amine to be subjected to a polymerization reaction.

2. The method of claim 1, wherein the step of producing an amine includes: impregnating the liquid or the mists of the isocyanate into the porous low dielectric constant film and subsequently, setting an atmosphere in which the substrate is placed to a water vapor atmosphere.

3. The method of claim 1, wherein the step of impregnating a liquid of isocyanate into the porous low dielectric constant film includes sweeping off an excess liquid of the isocyanate existing on a surface of the substrate by rotating the substrate.

4. The method of claim 1, wherein the step of heating the substrate to depolymerize the polymer is performed after the step of removing the pattern mask.

5. The method of claim 1, wherein the porous low dielectric constant film is an insulating film containing silicon, carbon and oxygen.

6. The method of claim 1, wherein the step of heating the substrate to depolymerize the polymer is performed by heating the substrate at a temperature between 300 degrees C. and 400 degrees C.

7. A method of manufacturing a semiconductor device, comprising:

supplying a raw material for polymerization to a porous low dielectric constant film formed on a substrate for manufacturing a semiconductor device, and filling holes formed in the porous low dielectric constant film with a polymer having a urea bond;

subsequently, forming a pattern mask for etching on a surface of the porous low dielectric constant film;

subsequently, etching the porous low dielectric constant film;

subsequently, removing the pattern mask; and heating the substrate to depolymerize the polymer, wherein the step of filling includes:

sequentially diffusing one and the other of a vapor of an isocyanate and a vapor of an amine into the porous low dielectric constant film; and heating the substrate to cause the isocyanate and the amine to be subjected to a polymerization reaction.

* * * * *